United States Patent
Lee et al.

(10) Patent No.: US 10,100,142 B2
(45) Date of Patent: Oct. 16, 2018

(54) POLYPHENYLENE ETHER MODIFIED PHENOL-BENZALDEHYDE MULTIFUNCTIONAL EPOXY RESIN AND USE

(71) Applicant: NAN YA PLASTICS CORPORATION, Taipei (TW)

(72) Inventors: Cheng-Chung Lee, Taipei (TW); Yeong-Tong Hwang, Taipei (TW); Chen-Hua Wu, Taipei (TW); Jaou-Shain Yu, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 198 days.

(21) Appl. No.: 15/071,733

(22) Filed: Mar. 16, 2016

(65) Prior Publication Data
US 2017/0267807 A1    Sep. 21, 2017

(51) Int. Cl.
C09D 163/04 (2006.01)
C08L 63/04 (2006.01)
(Continued)

(52) U.S. Cl.
CPC ........... C08G 59/14 (2013.01); C09D 163/00 (2013.01); H05K 1/0373 (2013.01); H05K 1/0237 (2013.01); H05K 2201/012 (2013.01)

(58) Field of Classification Search
None
See application file for complete search history.

(56) References Cited

U.S. PATENT DOCUMENTS 6,512,075 B1    1/2003    Tzou
2008/0097046 A1*   4/2008   Tokiwa ............... C08G 59/182
                                                                    525/523

FOREIGN PATENT DOCUMENTS

CN    102516530 B    3/2014
JP    2009-029923    2/2009
WO    2013083062 A1    6/2013

\* cited by examiner

*Primary Examiner* — Michael J Feely
(74) *Attorney, Agent, or Firm* — Li & Cai Intellectual Property (USA) Office

(57) ABSTRACT

The invention provides a polyphenylene ether modified phenol-benzaldehyde multifunctional epoxy resin with formula (I)

Formula (I)

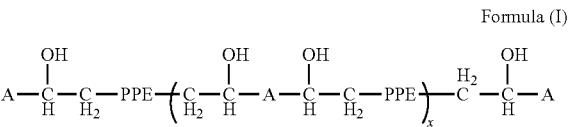

$x = 0 \sim 10$ wherein
A is:

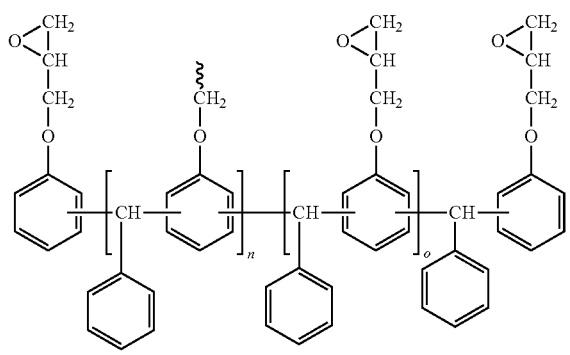

$n = 0 \sim 5$
$o = 0 \sim 5$

PPE are:

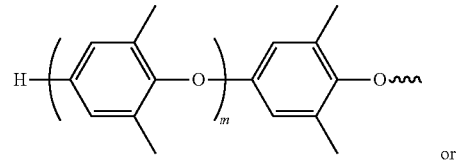

or

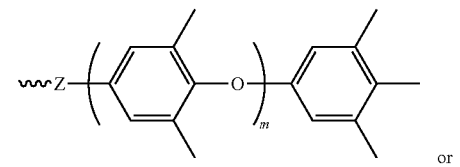

$m > 1$, integer (Continued)

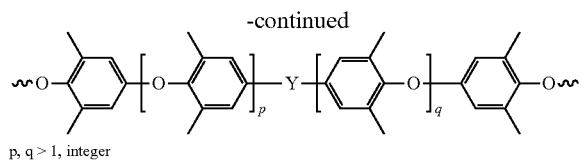

p, q > 1, integer

Z are:

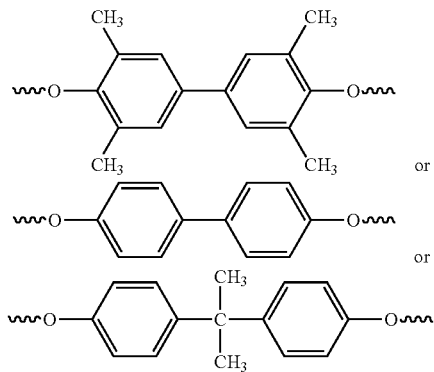

Y are:

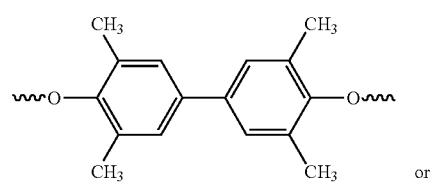

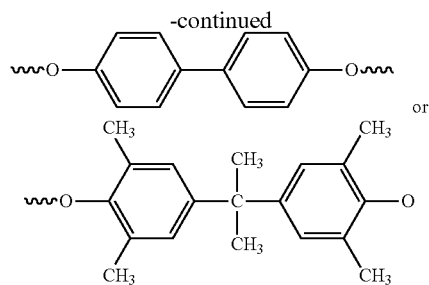

Their manufactured is following steps: polyphenylene ether 100 parts is dissolved in solvent, then phenol-benzaldehyde multifunctional epoxy resin 100~450 parts and catalyst 0.01~5 parts are added, stirred and mixed at 90~180 ℃, for 1~4 hour, to obtain formula (I) solution. Said product is formulated with compositions for laminate, having excellent electrical properties and heat resistance. The dielectric constant is 4.03(1 GHz), dissipation factor is 0.0046(1 GHz) and no delamination longer than 60 minutes dipping in 288 ℃ soldering test after 2 hours pressure cooking test. Application is insulating materials for highly reliable electronic components such as EMC, PCB substrates, laminate and insulating plates.

4 Claims, No Drawings

(51) Int. Cl.
    *C08G 59/14*    (2006.01)
    *C09D 163/00*   (2006.01)
    *H05K 1/03*     (2006.01)
    *B32B 27/38*    (2006.01)
    *H05K 1/02*     (2006.01)

POLYPHENYLENE ETHER MODIFIED PHENOL-BENZALDEHYDE MULTIFUNCTIONAL EPOXY RESIN AND USE

TECHNICAL FIELD

The present invention is related to a polyphenylene ether modified phenol-benzaldehyde multifunctional epoxy resin, which is applicable to glass fiber laminated plate and can achieve low dielectric constant (Dk), low dissipation factor (Df), and excellent heat resistance; therefore, the resin is very suitable for the signal transmission of high-frequency printed circuit board.

PRIOR ARTS

As the polyphenylene oxide or polyphenylene ether (PRO or PPE) has great characteristics in low dielectric constant and low dissipation factor (Low Dk/Df), it has been comprehensively used in the industry; however, when manufacturing the glass fiber laminated plate, the PPE and the glass fiber fabric are exclusive with the epoxy resin due to their poor impregnation; thus, the PPE and the epoxy resin may be separated from each other and the appearance and the dielectric characteristics of the prepreg will be influenced.

U.S. Pat. No. 6,512,075 (U.S. Pat. No. 6,512,075) disclosed the multifunctional phenol-benzaldehyde epoxy resin, and the chemical structure of the multifunctional phenol-benzaldehyde epoxy resin has high-density benzene ring structure and its proper function group number has more appropriate reaction than other multifunctional epoxy resins, such as the o-creso novolac epoxy resin (CNE), the tetrafunctional epoxy resin (TRE), bisphenol A type phenolic epoxy resin, naphthol phenolic multifunctional epoxy resin, etc.; besides, it has broad pressing processing region, excellent processing operation, which can effectively increase the production yield rate and production capacity, and has better electrical properties, excellent heat resistance and high Tg.

Chinese Patent No. 102516530 (CN 102516530) disclosed the epoxy modified polyphenylene ether resin, which has excellent electrical properties, which uses 100 parts of the polyphenylene ether and 5-60 parts of the epoxy resin to synthesize the prepolymerized solvent via catalyst; if the expoxy resin is the bifunctional epoxy resin, such as the bisphenol F type or bisphenol A type epoxy resin, it will has low Tg; if it is the multifunctional epoxy resin and use the above formula to form the net structure via the addition reaction, it will have high molecular mass and tend to be gel.

Japanese Publication No. 2009029923 (JP 2009029923) disclosed the comparison example I and comparison example II; the comparison I described using 60 g PPE and 40 g BPF epoxy resin to synthesize the prepolymerized solvent via catalyst (i.e. 100 parts of PPE and 66 parts of BPF epoxy resin); the comparison example II described using 70 g PPE and 30 g BPA epoxy resin to synthesize the prepolymerized solvent via catalyst (i.e. 100 parts of PPE and 42.8 parts of BPA epoxy resin), which has the formula similar to the epoxy modified polyphenylene ether resin of above Chinese Patent No. 102516530 (CN 102516530); the characteristics of the hot pressing glass fiber laminated plate of the comparison examples show low heat resistance and low Tg.

As the high-frequent signal transmission requirements of the electronic products ask high transmission speed, it is a very important issue to keep increasing the low dielectric performance of the epoxy resins in the future; therefore, it is necessary to develop a novel polyphenylene ether modified phenol-benzaldehyde multifunctional epoxy resin applicable to printed circuit board and having good dielectric characteristics so as to overcome the above problems.

SUMMARY OF THE INVENTION

Since the electronic products are developed to have high frequency and high speed, and require higher transmission speed, the up-stream raw materials of the printed circuit board, such as the glass fiber laminated plate, need to have lower dielectric constant and dissipation factor. For the purpose of solving the above problems, the object of the present invention is to provide a polyphenylene ether modified phenol-benzaldehyde multifunctional epoxy resin, as shown in formula (I); if the resin is formulated With the composition of the glass fiber laminated plate, it will have excellent electrical properties, heat resistance, dielectric constant Dk 4.03 (1 GHz) and dissipation factor Df (1 GHz); after the pressure cooking test (PCT) absorbed the water for 2 hours, its heat resistance allows it to be dipped in 288 ⌋ soldering test for 60 minutes and no delamination takes place.

Formula (I)

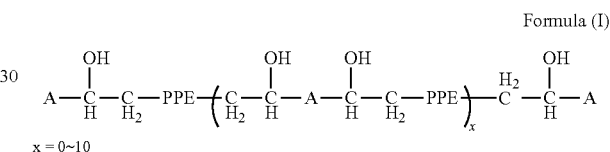

x = 0~10 wherein
A is:

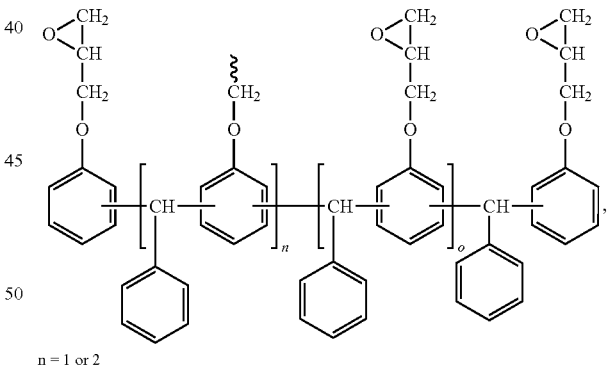

n = 1 or 2
o = 0~5 when A is a terminal group of Formula (I), n=1; and when A is not a terminal group, n=2;
PPE are:

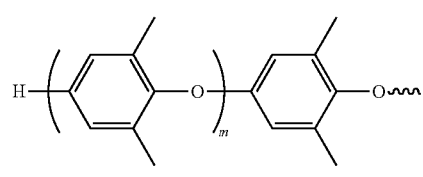

or

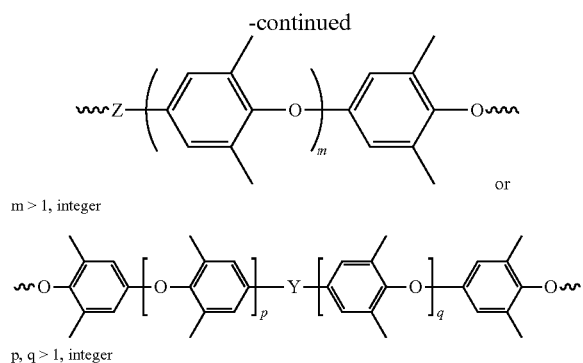

m > 1, integer p, q > 1, integer

Z are:

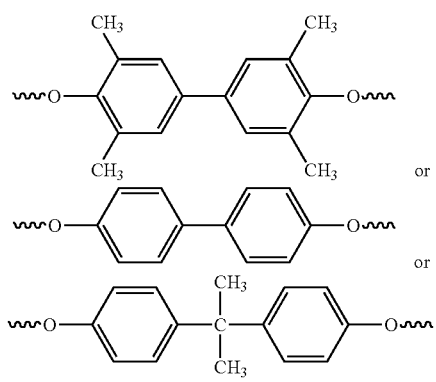

Y are:

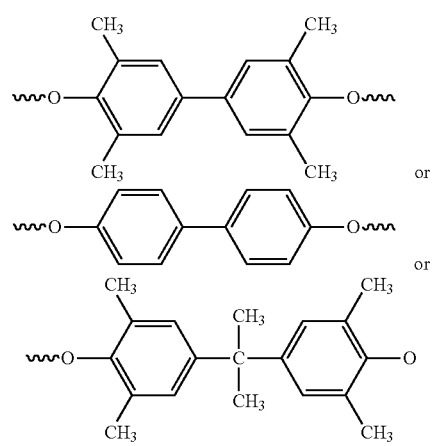

The design direction of the polyphenylene ether modified phenol-benzaldehyde multifunctional epoxy resin is to use the polyphenylene ether resin With proper average molecular mass Mn and low dielectric constant, and the phenol-benzaldehyde multifunctional epoxy resin with excellent electrical properties to conduct the addition reaction via catalyst to form the polyphenylene ether modified phenol-benzaldehyde multifunctional epoxy resin with low dielectric constant, low dissipation factor (Low Dk/Df) and high Tg.

The manufacturing method of the polyphenylene ether modified phenol-benzaldehyde multifunctional epoxy resin is:

Step (1) is the synthesis manufacturing of the polyphenylene ether PPE: (the quantity average molecular mass of the polyphenylene ether PPE is Mn=1500–4500) adding 100-500 parts of the solvent in the 100 parts of the polyphenylene ether PPE with the quantity average molecular mass Mn=1500–4500, and then adjusting its solid part to be 30-50%, and adding the 10-40 parts of the recombination agent, such as the bisphenol A (BRA), and adding 10-40 parts of the perbenzoic acid (BPO) by 2-4 times, and executing the cracking recombination reaction under 80~90 ⁻ for 1-5 hours, and adding the solvent to create the polyphenylene ether PPE solvent with 20% solid content, and adding 100 parts of water to wash which by water, and keeping which standing for 30 minutes to remove the water; using the same step to wash which again by water; finally, filtering the resin solvent to obtain the polyphenylene ether PPE (I) resin solvent with the quantity average molecular mass Mn=1500–6000 and 40% solid content. The solvent may be selected from the group consisting of toluene, xylenes, propylene glycol mono-methyl ether, methyl ethyl ketone and methyl isobutyl ketone; the recombination agent may be selected from the group consisting of the bisphenol A, bisphenol F, bisphenol, tetramethyl bisphenol and other frequently-used recombination agents; the solvent may be selected from the group consisting of toluene, xylenes, propylene glycol mono-methyl ether, methyl ethyl ketone or a combination thereof, or other frequently-used solvents of the glass fiber laminated plate.

Step (2) is the synthesis manufacturing of the polyphenylene ether modified phenol-benzaldehyde multifunctional epoxy resin: converting 500 parts of the polyphenylene ether PPE resin solvent of Step (I) into 100 parts of polyphenylene ether PPE solid, and adding 100-450 parts of the phenol-benzaldehyde multifunctional epoxy resin (NAN YA PLASTICS CORPORATION'S PRODUCT NAME: NPPN-433) and 0.01-5 parts of the catalyst in the polyphenylene ether PPE solid, increasing the temperature to 120~180⁻ to execute the addition reaction for 2-3 hours in order to obtain the polyphenylene ether modified phenol-benzaldehyde multifunctional epoxy resin solvent, wherein the catalyst may be a phosphor salt, including triphenyl phosphine, triphenyl butyl phosphonium bromide and ethyl triphenyl phosphonium acetate, etc., or a limidazole, including 2-ethylimidazole, 2-phenylimidazole, etc; and the solvent is selected from the group consisting of toluene, xylenes, propylene glycol mono-methyl ether, methyl ethyl ketone or the combination thereof, or other frequently-used solvents of the glass fiber laminated plate.

For the polyphenylene ether modified phenol-benzaldehyde multifunctional epoxy resin, it is the very important factor to control the proper quantity average molecular mass Mn of the polyphenylene ether; the optimal Mn control range is 1500-6000; the polyphenylene ether PPE with proper quantity molecular mass can be obtained by the cracking recombination reaction of the polyphenylene ether PPE with high molecular mass Mn13000-25000 or the polymerization synthesis of single 2,6-dimethylphenol with low molecular mass; when Mn<1500, the effects of the low dielectric constant and low dissipation factor of the polyphenylene ether PPE are not enough; when Mn>6000, the water washing and water separation of the polyphenylene ether PPE are not ideal and its solubility in solvent will be reduced, which will make its viscosity become high during the reaction of the polyphenylene ether modified phenol-benzaldehyde multifunctional epoxy resin; thus, the reaction of the polyphenylene ether modified phenol-benzaldehyde multifunctional epoxy resin cannot be smooth.

The chemical structure of the polyphenylene ether PPE with proper quantity molecular mass Mn1500~6000 manufactured by the cracking recombination reaction of the polyphenylene ether with high molecular mass is as follows:

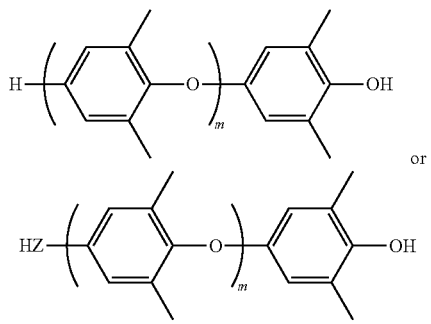

or

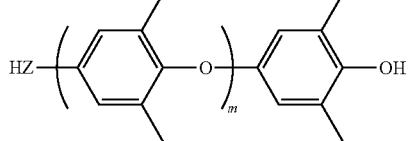

m > 1, integer

Z are:

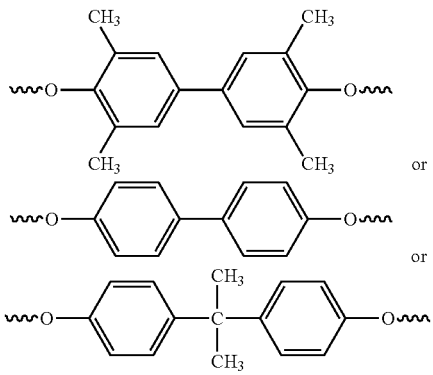

The chemical structure of the polyphenylene ether PPE with proper quantity molecular mass Mn1500~6000 manufactured by the polymerization synthesis of single 2,6-dimethylphenol with low molecular mass is as follows:

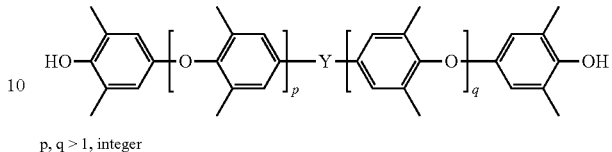

p, q > 1, integer

Y are:

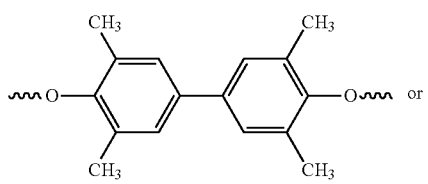

or

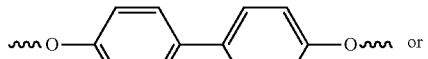

or

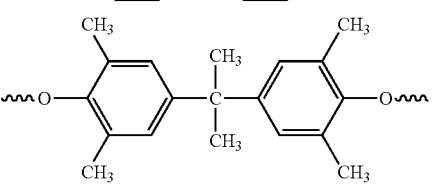

The chemical reaction formula of the polyphenylene ether modified phenol-benzaldehyde multifunctional epoxy resin disclosed by the present invention is as follows:

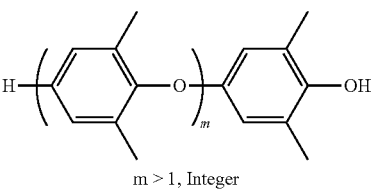

m > 1, Integer or

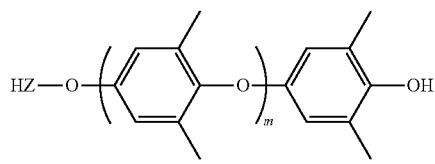

or

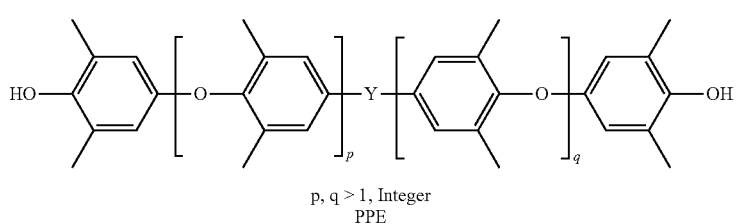

p, q > 1, Integer
PPE

+

-continued

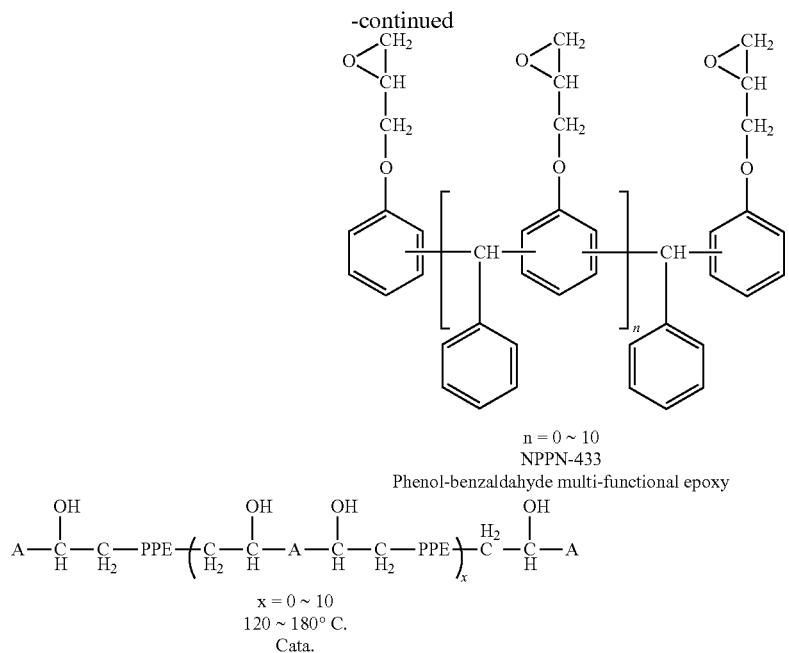

n = 0 ~ 10
NPPN-433
Phenol-benzaldahyde multi-functional epoxy $$A-\underset{H}{\overset{OH}{\underset{|}{C}}}-\underset{H_2}{\overset{}{\underset{|}{C}}}-PPE-\left(\underset{H_2}{\overset{}{\underset{|}{C}}}-\underset{H}{\overset{OH}{\underset{|}{C}}}-A-\underset{H}{\overset{OH}{\underset{|}{C}}}-\underset{H_2}{\overset{}{\underset{|}{C}}}-PPE\right)_x-\overset{H_2}{\underset{}{C}}-\underset{H}{\overset{OH}{\underset{|}{C}}}-A$$

x = 0 ~ 10
120 ~ 180° C.
Cata.

A is:

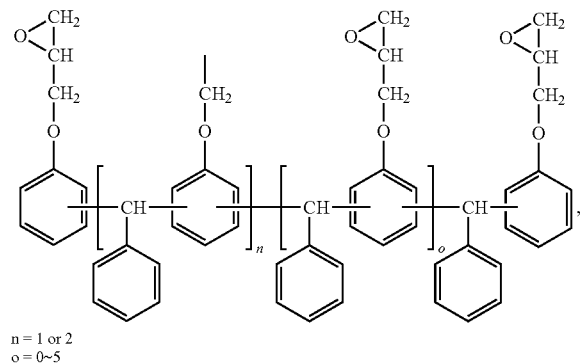

n = 1 or 2
o = 0~5 when A is a terminal group of Formula (I), n=1; and when A is not a terminal group, n=2;

The present invention also discloses an epoxy resin varnish composition applicable to the glass fiber laminated plate, which includes the content (1): the usage amount of the polyphenylene ether modified phenol-benzaldehyde multifunctional epoxy resin according to the present invention is 40-80% of the total resin amount (the total resin amount is equal to the total amount of the content 1~content 4); the content (2): the usage amount of the 2,6-dimethylphenol difunctional epoxy resin is 0-20% of the total resin amount; the content (3)—the hardening agent 1: the usage amount of the phenolic resin hardening agent or bisphenol A type phenolic resin hardening agent is 0-30% of the total resin amount; the content (4)—the flame retartant: the flame retartent includes the phosphorus-containing flame retardant, such as the phosphorus-containing bisphenol A type novolac hardening agent with 9.2-9.5% phosphorus content, and the nitrogen-containing flame retartart, such as the melamine phenolic resin, and the bromine-containing flame retartant, such as the tetrabromobisphenol A; the usage amount is 10-40% of the total resin amount; the content (5)—the filler: the filer may be SiO2, Al(OH)3, etc., and the usage amount is 0-45% of the total varnish content; the content (6): Adding proper the hardening promoter and the solvent, the hardening promoter may be the limidazole, quaternary amine, quaternary phosphor salt; the most frequently-used promoters are 2-methylimidazole, 2-phenylimidazole; the proper usage amount of the promoter is 0.01-0.2 phr (compared with all main epoxy resins, not including the hardening agents); the solvent may be ketone, glycol ether, such as acetone, butanone, cycolhexanone, 2-methoxyethanol (MCS), propylene glycol mono-methyl ether; the proper solid content is 55-70%.

The varnish combination of the above polyphenylene ether modified phenol-benzaldehyde multifunctional epoxy resin varnish composition can be processed by the dipped glass fiber fabric to manufacture the semi-hardening plastic films, and which are pressed to be the glass fiber laminated plate, which has excellent electrical properties, heat resistance, dielectric constant Dk 4.03 (1 GHz) and dissipation factor Df 0.0046 (1 GHz); after the pressure cooking test absorbs the water from which for 2 hours, which can be processed by 288┐ soldering for more than 60 minutes and no delamination takes place. Thus, the product is very helpful for the signal transmission of the high-frequent circuit board.

The technical features of the present invention have at least the following advantages: taking advantage of the excellent low dielectric constant and low dissipation factor of both phenol-benzaldehyde multifunctional epoxy resin and the polyphenylene ether PPE and using them to conduct the addition reaction to create the polyphenylene ether modified phenol-benzaldehyde multifunctional epoxy resin for the manufacturing technology of the printed circuit board, which can effectively the dielectric performance of the glass fiber laminated plate, and achieve good heat resistance and low dielectric performance; thus, the resin is very helpful for the signal transmission of the high-frequent circuit board. The designed polyphenylene ether PPE with proper quantity average molecular mass Mn is created by the cracking recombination reaction of the polyphenylene ether PPE with high molecular mass or the polymerization reaction of the 2,6-dimethylphenol with low molecular mass; then, the polyphenylene ether modified phenol-benzaldehyde multifunctional epoxy resin according to the present invention can be created by the addition reaction of the phenol-benzaldehyde multifunctional epoxy resin, wherein the material ratio of the polyphenylene ether PPE and the phenol-benzaldehyde multifunctional epoxy resin is: 100 parts of the polyphenylene ether PPE: 100-500 parts of the phenol-benzaldehyde multifunctional epoxy resin; the reaction will not result in high viscosity and gel phenomenon; the polyphenylene ether modified phenol-benzaldehyde multifunctional epoxy resin has good compatibility with the polyphenylene ether, which are not separated and have good impregnation with the glass fiber fabric; besides, the semi-hardening plastic films have smooth appearance.

DETAILED DESCRIPTION OF THE PREFERRED EMBODIMENT

The detailed structure, operating principle and effects of the present invention will now be described in more details hereinafter with reference to the various embodiments of the invention as follows.

The embodiment 0-1: the synthesis of the polyphenylene ether PPE with proper quantity average molecular mass Mn1500-6000:

Adding 150 parts of the toluene solvent in 100 parts of the polyphenylene ether PPE (Asahi 5202A) with the quantity average molecular mass Mn1500-6000, and adjusting the solid part to be 40%, and adding 30 parts of the recombination agent "bisphenol A (BPA)", and adding 30 parts of the perbenzoic acid (BPO) by 2-4 times, and each time is 7.5 parts, and conducting the cracking recombination reaction under 80⁻ for 2 hours, and adding 370 parts of the toluene solvent to create the polyphenylene ether PPE resin solvent with 20% solid content, and adding 100 parts of water to wash which by water, and keeping which standing for 30 minutes to remove the water; using the same step to wash which again by water; finally, filtering the resin solvent to obtain the polyphenylene ether PPE (I) resin solvent with the quantity average molecular mass Mn=3791 and the yield rate is 98%.

The embodiment 0-2:

Converting 500 parts of the polyphenylene ether PPE (I) resin solvent of Step (1) to 100 parts of the solid polyphenylene ether PPE, and adding 400 parts of the phenol-benzaldehyde multifunctional epoxy resin (NAN YA PLASTICS CORPORATION'S PRODUCT NAME: NPPN-433), and adding 0.5 part (0.1%) of the triphenyl phosphine (TPP), and increase the temperature to 170⁻ to conduct the addition reaction for 2 hours; then, the polyphenylene ether modified phenol-benzaldehyde multifunctional epoxy resin solvent can be obtained; the yield rate is 100%; the quantity average molecular mass Mn of the obtained polyphenylene ether PPE modified phenol-benzaldehyde multifunctional epoxy resin I (20% PPE) is 997 and its weight average molecular mass Mw is 3851, and its epoxy equivalent weight is 309.5 g/eq.

The embodiment 0-3:

Dissolving 100 parts of the solid polyphenylene ether PPE (Sabic MX-90) in 150 parts of the toluene, and adding 369 parts of the phenol-benzaldehyde multifunctional epoxy resin (NAN YA PLASTICS CORPORATION'S PRODUCT NAME: NPPN-433), and adding 0.5 part (0.1%) of the triphenyl phosphine (TPP), and increase the temperature to 170⁻ to conduct the addition reaction for 2 hours; then, the polyphenylene ether modified phenol-benzaldehyde multifunctional epoxy resin solvent can be obtained; the yield rate is 100%; the quantity average molecular mass Mn of the obtained polyphenylene ether PPE modified phenol-benzaldehyde multifunctional epoxy resin II (21.3% PPE) is 1258 and its weight average molecular mass Mw is 5937, and its epoxy equivalent weight is 343 g/eq.

The embodiment 0-4:

Converting 500 parts of the polyphenylene ether PPE (I) resin solvent of Step (1) to 100 parts of the solid polyphenylene ether PPE, and adding 233 parts of the phenol-benzaldehyde multifunctional epoxy resin (NAN YA PLASTICS CORPORATION'S PRODUCT NAME: NPPN-433), and adding 0.33 part (0.1%) of the triphenyl phosphine (TPP), and increase the temperature to 170⁻ to conduct the addition reaction for 2 hours; then, the polyphenylene ether modified phenol-benzaldehyde multifunctional epoxy resin solvent can be obtained; the yield rate is 100%; the quantity average molecular mass Mn of the obtained polyphenylene ether PPE modified phenol-benzaldehyde multifunctional epoxy resin III (30% PPE) is 1152 and its weight average molecular mass Mw is 5928, and its epoxy equivalent weight is 354.5 g/eq.

The embodiment 1-3:

The polyphenylene ether modified phenol-benzaldehyde multifunctional epoxy resin according to the present invention is applied to the glass fiber laminated plate, and the formula composition is as shown in Table (1), which adopts the solvent, such as the propylene glycol mono-methyl ether (PM), methyl ethyl ketone, acetone, or the resin varnish formula composition with 65% adjusted solid part; using the conventional method to manufacturing the glass fiber laminated plate and immersing the 7268 glass fiber fabric into the above resin liquid, and then drying which under 170⁻ for several minutes; afterward, the lowest melt viscosity of the pre-impregnated body after dried can be adjusted to be 4000-10000poise by controlling the drying time; finally, putting 8 pre-impregnated bodies between two the copper foils with 35-um thickness, and then controlling the heating program under 25 kg/cm2 preasure:

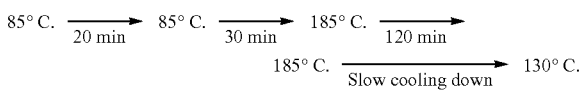

The copper foil substrate with 1.6 mm thickness can be obtained by hot pressing.

The comparison example 1-2:

If the polyphenylene ether modified phenol-benzaldehyde multifunctional epoxy resin according to the present invention is not applied and using other multifunctional epoxy resins as the comparison examples, the comparison example 1 is the phenol-benzaldehyde multifunctional epoxy resin NPPN-433, and the comparison example 2 is the bisphenol A type phenolic epoxy resin; its formula composition is as shown in Table (2).

The embodiments of Table (1)—The varnish composition and the physical characteristics of the glass fiber laminated plate

|  |  | Embodiment 1 | Embodiment 2 | Embodiment 3 |
|---|---|---|---|---|
| Resin varnish formula composition | Polyphenylene ether modified phenol-benzaldehyde multifunctional epoxy resin I, II, III according to the present invention | Embodiment 0-2<br>33 | Embodiment 0-3<br>33.7 | Embodiment 0-4<br>33.9 |
|  | 2,6-dimethylphenol difunctional epoxy resin NAN YA PLASTICS CORPORATION NPPN-260 | 8.2 | 8.4 | 8.5 |
|  | BPA-PN phenolic resin hardening agent NAN YA PLASTICS CORPORATION NPEH-720H | 11.8 | 10.9 | 10.7 |
|  | Phosphorus-containing bisphenol A type phenolic resin hardening agent SHIN-A LC-950, the phosphorus content is 9.5%. | 16.9 | 16.9 | 16.9 |
|  | Filler SiO2 | 30 | 30 | 30 |
|  | Hardening promoter – 2-methylimidazole 2MI | 0.08 | 0.08 | 0.08 |
|  | Acetone solvent + PM | 66 | 66 | 66 |
| Gel time | Varnish gel time second/170□ | 240 | 245 | 200 |
|  | Prepreg gel time second/170□ | 120 | 121 | 115 |
| The physical characteristics of the glass fiber laminated plate | Phosphorus content % | 2.3 | 2.3 | 2.3 |
|  | Flame retardance | UL-94V0 | UL-94V0 | UL-94V0 |
|  | Temperature of glass transition Tg□ | 158 | 159 | 158 |
|  | Water absorption rate % (by PCT for 2 hours) | 0.24 | 0.28 | 0.26 |
|  | 288□ dipped soldering heat resistance (By PCT for 2 hours) | >60 minutes No delamination takes place. | >60 minutes No delamination takes place. | >60 minutes No delamination takes place. |
|  | Dielectric constant Dk (1 GHz) | 4.07 | 4.03 | 4.09 |
|  | Dissipation factor Df (1 GHz) | 0.0049 | 0.0046 | 0.0048 |

The comparison examples of Table (1)—The varnish composition and the physical characteristics of the glass fiber laminated plate

|  |  | Comparison example 1 | Comparison example 2 |
|---|---|---|---|
| Resin varnish formula composition | Phenol-benzaidehyde multifunctional epoxy resin NPPN-433 | 30.8 | — |
|  | Bisphenol A type phenolic epoxy resin NPPN-438 | — | 29 |
|  | 2,6-dimethylphenol difunctional epoxy resin NAN YA PLASTICS CORPORATION NPPN-260 | 7.7 | 7.3 |
|  | BPA-PN phenolic resin hardening agent NPEH-720H | 14.5 | 16.8 |
|  | Phosphorus-containing bisphenol A type phenolic resin hardening agent SHIN-A LC-950, the phosphorus content is 9.5%. | 17 | 17 |
|  | Filler SiO2 | 30 | 30 |
|  | Hardening promoter – 2-methylimidazole 2MI | 0.05 | 0.04 |
|  | Acetone solvent + PM | 66 | 66 |
| The physical characteristics of the glass fiber laminated plate | Phosphorus content % | 2.3 | 2.3 |
|  | Flame retardance | UL-94V0 | UL-94V0 |
|  | Temperature of glass transition Tg□ | 166 | 164 |
|  | Water absorption rate % (by PCT for 2 hours) | 0.3 | 0.3 |
|  | 288□ dipped soldering heat resistance (by PCT for 2 hours) | >10 minutes No delamination takes place. | >10 minutes No delamination takes place. |
|  | Dielectric constant Dk (1 GHz) | 4.4 | 4.6 |
|  | Dissipation factor Df (1 GHz) | 0.011 | 0.016 |

According to the above test results, the polyphenylene ether modified phenol-benzaldehyde multifunctional epoxy resin according to the present invention is formulated to manufacture the glass fiber laminated plate; the dielectric constant Dk can be reduced up to 4.03; compared with comparison example, the dielectric constant can be reduced from 4.6 to 4.03, which shows the polyphenylene ether modified phenol-benzaldehyde multifunctional epoxy resin can effectively reduce the dielectric constant and very suitable for the circuit board for high-frequent signal transmission.

1. Varnish Gel Time

The varnish reaction test is to use the epoxy resin solvent, hardening agent "dicydiamide solvent" (dissolved in the solvent DMF; the solvent concentration-13.3%) and the promoter "2-phenyl imidazole" or "2-methyl imidazole" (dissolved in the solvent DMF; the solvent concentration=14.28%) to prepare the varnish mixture liquid; adding 0.3 ml of the varnish mixture liquid on the heat plate and the temperature of the heat plate is 170 ; afterward, recording the gel time.

2. Prepreg Gel Time

The test method of the pre-impregnated body is to put 0.2 mg of the pre-impregnated body powder on the heat plate and the temperature of the heat plate is 170 ; afterward, recording the gel time.

3. Water absorption rate test (2 hours by the pressure cooking test PCT)

The test method of the water absorption rate is to cut the etched substrate into 5 cm² square test plate and put which in 105 oven to bake for 2 hours, and then put the test plate in the pressure cooker; the condition of the pressure cooker is 2 atm×120 ; after 120 minutes, recording the weight difference before/after processed by the pressure cooker and divide which by the initial weight of the test plate, and the water absorption rate is obtained.

4. 288 soldering heat resistance (by PCT for 2 hours)

The test method is to dip the above test plate processed by the pressure cooker into 288 soldering stove, and the record the time for the delamination of the test plate.

5. Dielectric Constant Test:

The test method is to remove the cooper foil of the 5 cm×5 cm square test plate of the glass fiber laminated plate and then put which in 105 oven to bake for 2 hours; afterward, using the thickness measurer to measure the thickness and then putting the test plate in the dielectric constant measurer to measure the data of the three points; finally, calculating the average value of which.

6. Dissipation Factor Test:

The test method is to remove the cooper foil of the 5 cm×5 cm square test plate of the glass fiber laminated plate and then put which in 105⁻ oven to bake for 2 hours; afterward, using the thickness measurer to measure the thickness and then putting the test plate in the dielectric constant measurer to measure the data of the three points; finally, calculating the average value of which.

7. Temperature of Glass Transition Test:

Using the differential scaning calorimeter (DSC) and the heating speed is 20 /min.

8. Flame Retardance

Test the flame retardance of the sample according to the UL-94 standard method.

What we claimed are:

1. A polyphenylene ether modified phenol-benzaldehyde multifunctional epoxy resin having the formula (I):

Formula (I)

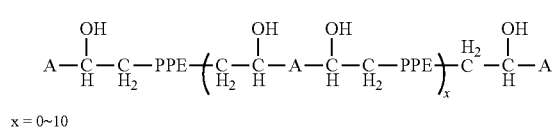

x = 0~10 wherein
A is:

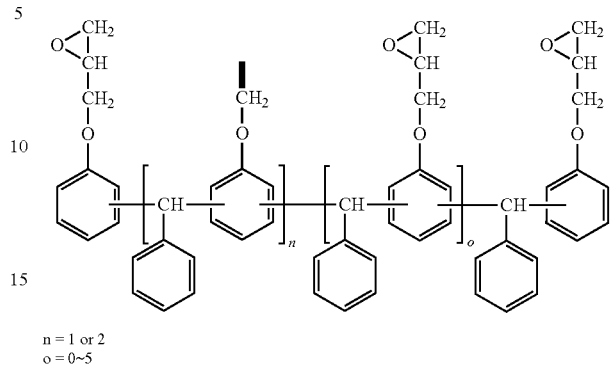

n = 1 or 2
o = 0~5 when A is a terminal group of Formula (I), n=1; and when A is not a terminal group, n=2;

PPE are:

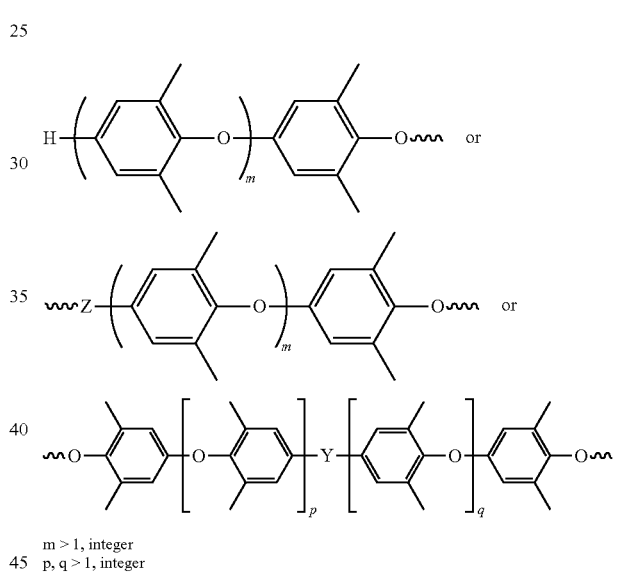

m > 1, integer
p, q > 1, integer

Z are:

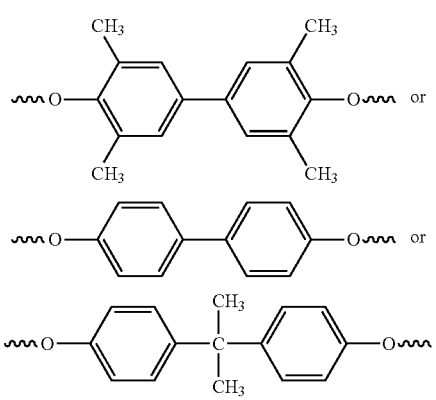

Y are:

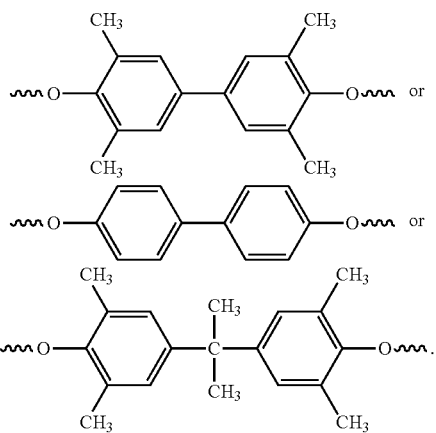

2. A method of manufacturing the polyphenylene ether modified phenol-benzaldehyde multifunctional epoxy resin of claim 1, the method comprising:
preparing a polyphenylene ether PPE resin solution having a 40% solid content, said solution comprising a solvent and a polyphenylene ether PPE resin with an average molecular mass Mn of 1500-6000;
converting 500 parts of the polyphenylene ether PPE resin solution to 100 parts of the polyphenylene ether PPE solid;
adding 100-450 parts of a phenol-benzaldehyde multifunctional epoxy resin and 0.01-5 parts of a catalyst to the polyphenylene ether PPE solid; and
reacting the polyphenylene ether PPE solid and the phenol-benzaldehyde multifunctional epoxy resin at a temperature of 120~180° C. for 2-3 hours in order to obtain the polyphenylene ether modified phenol-benzaldehyde multifunctional epoxy resin;
wherein the catalyst is the a phosphor salt or an imidazole; and wherein the solvent is selected from the group consisting of toluene, xylenes, propylene glycol monomethyl ether, methyl ethyl ketone and a combination thereof.

3. The method of claim 2, wherein the polyphenylene ether PPE resin with an average molecular mass Mn of 1500-6000 is manufactured by a cracking recombination reaction of a polyphenylene ether PPE with high molecular mass Mn of 13000~25000, or a polymerization reaction of 2,6-dimethylphenol with low molecular mass.

4. An epoxy resin varnish composition applicable to glass fiber laminated plate, comprising:
(A) the polyphenylene ether modified phenol-benzaldehyde multifunctional epoxy resin of claim 1;
(B) an optional 2,6-dimethylphenol difunctional epoxy;
(C) an optional hardening agent selected from a phenolic resin hardening agent or a bisphenol A type phenolic resin hardening agent;
(D) a flame retardant selected from a phosphorus-containing flame retardant, a nitrogen-containing flame retardant, and a bromine-containing flame retardant;
(E) an optional filler;
(F) a hardening promoter; and
(G) a solvent;
wherein (A) is present in an amount of 40-80 wt % of the combined amount of (A), (B), (C) and (D);
wherein (B) is present in an amount of 0-20 wt % of the combined amount of (A), (B), (C) and (D);
wherein (C) is present in an amount of 0-30 wt % of the combined amount of (A), (B), (C), and (D);
wherein (D) is present in an amount of 10-40 wt % of the combined amount of (A), (B), (C), and (D);
wherein (E) is present in an amount of 0-45 wt % of the varnish composition;
wherein (F) is present in an amount of 0.01-0.2 phr, based on epoxy resins present of the varnish composition; and
wherein (G) is present in an amount to render a varnish composition solids content of 55-70%.

* * * * *